(12) United States Patent
Hafen et al.

(10) Patent No.: US 9,753,066 B2
(45) Date of Patent: Sep. 5, 2017

(54) METHODS AND APPARATUS OF ANALYZING ELECTRICAL POWER GRID DATA

(71) Applicant: Battelle Memorial Institute, Richland, WA (US)

(72) Inventors: Ryan P. Hafen, West Richland, WA (US); Terence J. Critchlow, Richland, WA (US); Tara D. Gibson, West Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 1030 days.

(21) Appl. No.: 13/928,108

(22) Filed: Jun. 26, 2013

(65) Prior Publication Data
US 2013/0345999 A1  Dec. 26, 2013

Related U.S. Application Data

(60) Provisional application No. 61/664,604, filed on Jun. 26, 2012.

(51) Int. Cl.
*G06F 19/00* (2011.01)
*G01R 21/133* (2006.01)
(Continued)

(52) U.S. Cl.
CPC ....... *G01R 21/133* (2013.01); *G01R 19/2513* (2013.01); *H02J 13/0086* (2013.01); *H02J 2003/001* (2013.01); *H02J 2003/007* (2013.01); *Y02E 60/728* (2013.01); *Y02E 60/76* (2013.01); *Y04S 10/265* (2013.01); *Y04S 10/525* (2013.01); *Y04S 40/22* (2013.01)

(58) Field of Classification Search
USPC ............................ 700/295, 297, 298; 702/22
See application file for complete search history.

(56) References Cited

U.S. PATENT DOCUMENTS

| | | | | |
|---|---|---|---|---|
| 2005/0261838 | A1* | 11/2005 | Andreev | G01N 30/8603 702/22 |
| 2011/0245987 | A1* | 10/2011 | Pratt | H01M 10/44 700/295 |

FOREIGN PATENT DOCUMENTS

| | | |
|---|---|---|
| WO | PCT/US2013/047983 | 4/2014 |
| WO | PCT/US2013/047983 | 12/2014 |

OTHER PUBLICATIONS

"A Hadoop Cluster", URL http://hadoop.apache.org/common/releases.html, Jun. 22, 2012, 6 pages.
(Continued)

*Primary Examiner* — Lam Nguyen
(74) *Attorney, Agent, or Firm* — Wells St. John P.S.

(57) ABSTRACT

Apparatus and methods of processing large-scale data regarding an electrical power grid are described. According to one aspect, a method of processing large-scale data regarding an electrical power grid includes accessing a large-scale data set comprising information regarding an electrical power grid; processing data of the large-scale data set to identify a filter which is configured to remove erroneous data from the large-scale data set; using the filter, removing erroneous data from the large-scale data set; and after the removing, processing data of the large-scale data set to identify an event detector which is configured to identify events of interest in the large-scale data set.

24 Claims, 7 Drawing Sheets

(51) Int. Cl.
*G01R 19/25* (2006.01)
*H02J 13/00* (2006.01)
*H02J 3/00* (2006.01)

(56) References Cited

OTHER PUBLICATIONS

"Divide and Recombine (D & R) with RHIPE: Deep Analysis of Complex Big Data using the R Environment", URL http://www.rhipe.org which redirects to http://www.datadr.org, Jun. 16, 2012, 2 pages.
"Hadoop" URL http://hadoop.apache.org, Jun. 23, 2012, 2 pages.
"The Comprehensive R Archive Network", URL http://cran.r-project.org, Jun. 4, 2011, 1 page.
"The R Project for Statistical Computing", URL http://www.r-project.org, Jun. 20, 2012, 1 page.
"The R-Hadoop Integrated Processing Environment (RHIPE) Library", URL https://github.com/saptarshiguha/RHIPE, Apr. 5, 2010, 2 pages.
Acar et al., "Framework for Large-Scale Modeling and Simulation of Electricity Systems for Planning, Monitoring, and Secure Operations of Next-Generation Electricity Grids" IBM Smarter Energy Research, Feb. 28, 2011, United States, 73 pages.
Baldwin et al., "Multi-Resolution Modeling of Large Scale Scientific Simulation Data", Proceedings of the 12th International Conference on Information and Knowledge Management, Nov. 3-8, 2003, New Orleans, LA, 12 pages.
Bisciglia, "The Smart Grid: Hadoop at the Tennessee Valley Authority (TVA)", URL http://blog.cloudera.com/blog/2009/06/smart-grid-hadoop-tennessee-valley-authority-tva/, Jun. 2, 2009, 5 pages.
Chu et al., "Map-Reduce for Machine Learning on Multicore", Advances in Neural Information Processing Systems 19, 2007, Canada, pp. 281-288.
Dean et al., "MapReduce: Simplified Data Processing on Large Clusters", Communications of the ACM vol. 51, No. 1, Jan. 2008, United States, pp. 107-113.
Gorton et al., "GridOPTICS™ A Novel Software Framework for Integrating Power Grid Data Storage, Management and Analysis", Hawaii International Conference on System Sciences, Jan. 2013, United States, 11 pages.
Hafen et al., "Chapter 1: Power Grid Data Analysis with R and Hadoop", Data Mining Applications With R, Zhao and Cen (eds.) Elsevier, 2013, United States, 35 pages.
Litos Strategic Communication, "The Smart Grid; An Introduction", U.S. Department of Energy, Contract No. DE-AC26-04NT41817, 2008, United States, 48 pages.
Overbye et al., "Using PMU Data to Increase Situational Awareness", Power System Engineering Research Center (PSERC) Publication, 2010, United States, 70 pages.
Read et al., "A Multi-Resolution Relational Data Model" Proceedings of the 18th International Conference on Very Large Databases in Vancouver, Canada, 1992, pp. 139-150.
Rhodes et al., "A Data Model for Adaptive Multi-Resolution Scientific Data", Data Visualization: The State of the Art, 2003, United States, 16 pages.
Rusitschka et al., "Smart Grid Data Cloud: A Model for Utilizing Cloud Computing in the Smart Grid Domain", IEEE International Conference on Smart Grid Communications, Oct. 4, 2010, United States, pp. 483-488.
White, "Hadoop: The Definitive Guide", O'Reilly Media, Inc., 2009, United States, 513 pages.
Haber et al., "A Data Model for Scientific Visualization with Provisions for Regular and Irregular Grids", Proceedings of IEEE Visualization 1991, San Diego, CA, pp. 298-305.
Qiu et al., "Internet Based Frequency Monitoring Network (FNET)", IEEE Power Engineering Society Winter Meeting vol. 3, 2001, United States, pp. 1166-1171.
Speray et al., "Volume Probes: Interactive Data Exploration on Arbitrary Grids", Computer Graphics vol. 24, No. 5, ACM, 1990, United States, 8 pages.
"Revolution Analytics", URL http://www.revolutionanalytics.com, Jun. 24, 2012, 1 page.
"TIOBE 2012 Programming Community Index", URL http://www.tiobe.com/index.php/content/company/Home.html, Jun. 9, 2012, 1 page.
Becker et al., "The Visual Design and Control of Trellis Display", Journal of Computational and Graphical Statistics vol. 5, No. 2, 1996, United States, pp. 123-155.
Critchlow et al, U.S. Appl. No. 61/664,604, filed Jun. 26, 2012, titled "Framework for Analyzing Power Grid Data", 47 pages.
Jeffery et al., "A Pipelined Framework for Online Cleaning of Sensor Data Streams", IEEE Proceedings of the 22nd International Conference on Data Engineering (ICDE'06), 2006, United States, 3 pages.
Rahm et al., "Data Cleaning: Problems and Current Approaches", IEEE Data Engineering Bulletin vol. 23, No. 4, 2000, United States, pp. 3-13.
Zhang et al., "Wide-Area Frequency Monitoring Network (FNET) Architecture and Applications", IEEE Transactions on Smart Grid vol. 1, No. 2, 2010, United States, pp. 159-167.

\* cited by examiner

METHODS AND APPARATUS OF ANALYZING ELECTRICAL POWER GRID DATA

RELATED PATENT DATA

This application claims priority from U.S. Provisional Patent Application No. 61/664,604 filed 26 Jun. 2012 entitled "Framework for Analyzing Power Grid Data", the teachings of which are incorporated by reference herein.

STATEMENT AS TO RIGHTS TO INVENTIONS MADE UNDER FEDERALLY-SPONSORED RESEARCH AND DEVELOPMENT

This invention was made with Government support under Contract DE-AC05-76RLO1830 awarded by the U.S. Department of Energy. The Government has certain rights in the invention.

TECHNICAL FIELD

This disclosure relates to methods and apparatus of analyzing electrical power grid data.

BACKGROUND OF THE DISCLOSURE

Usage of electrical energy is ubiquitous in almost every aspect of life. Businesses, entertainment, communications, etc. are heavily dependent upon electrical energy for fundamental operation. Electrical power systems, such as electrical power grids, provide electrical energy to households, businesses, manufacturing facilities, hospitals, etc. Electrical power systems are ever-changing dynamic systems and operations are often concerned with maintaining stability upon the electrical power system including balancing generation with load.

At least some aspects of the present disclosure are directed towards improved apparatus and methods for analyzing electrical power systems including the processing of large-scale sets of data indicative of an electrical power system.

BRIEF DESCRIPTION OF THE DRAWINGS

Example embodiments of the disclosure are described below with reference to the following accompanying drawings.

DETAILED DESCRIPTION OF THE DISCLOSURE

Figure 1:
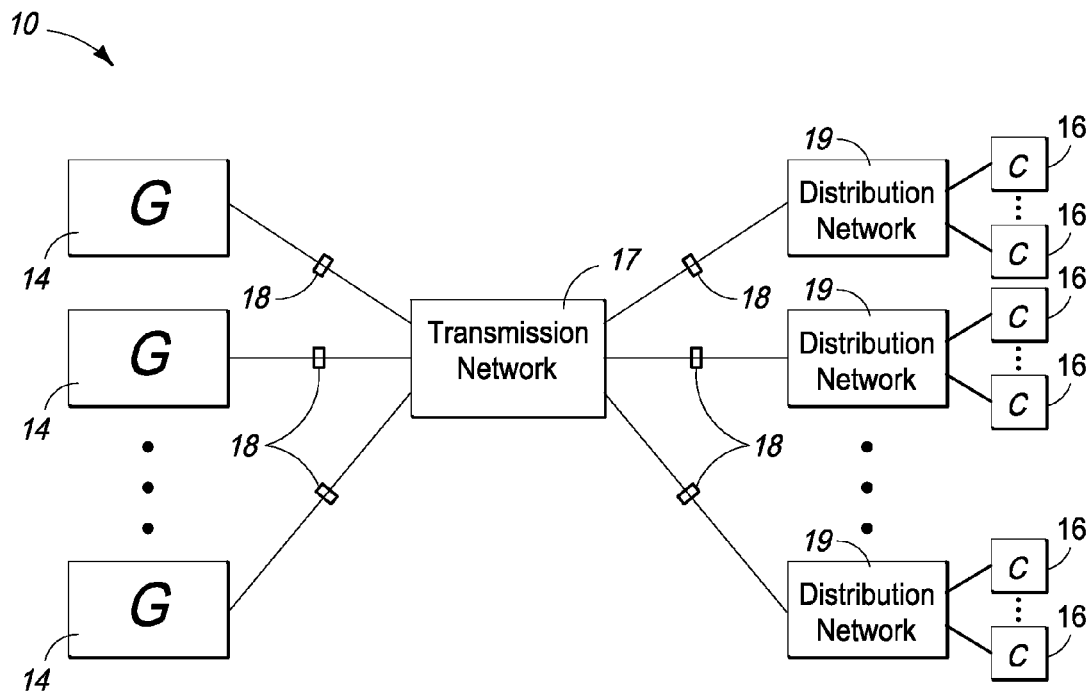
FIG. 1 is a functional block diagram of an electrical power system according to one embodiment.

This disclosure is submitted in furtherance of the constitutional purposes of the U.S. Patent Laws "to promote the progress of science and useful arts" (Article 1, Section 8).

As discussed further below, large numbers of sensors may be deployed to monitor electrical power systems, such as an electrical power grid. This deployment has provided utilities with an extraordinary amount of data to process. The sheer quantity of data to analyze can outstrip a utilities' ability to effectively process such information.

At least some aspects of the disclosure are directed towards apparatus and methods of performing exploratory data analysis upon large-scale data sets, for example, data sets generated in the electrical power system domain by the above-mentioned sensors. In some embodiments, a framework and method are detailed that employ a statistical software package such as "R" (available at www.r-project.org/), the R-Hadoop Integrated Processing Environment (RHIPE) library (https://github.com/saptarshiguha/RHIPE) which allows in-depth review of data in an iterative fashion, a Hadoop cluster (http://hadoop.apache.org/common/releases.html), and a relational database (e.g., SQL server). The teachings of the above-identified references are incorporated herein by reference.

The RHIPE environment allows both rapid prototyping of methods (e.g., via the R statistical programming environment) and scalability (via Hadoop), enabling a comprehensive iterative analysis process for reviewing and analyzing entire large-scale data sets. The analysis framework has been extensively tested on real PMU data obtained from the Electricity Infrastructure Operations Center (EIOC) at the Pacific Northwest National Laboratory, Richland, Wash. as discussed in further detail below. An approach may employ multiple R (statistical) rules/filters to identify erroneous data within data sets as well as identify events of interest which occur in the data set. Identified events may be stored in a repository for additional analysis and use.

Some of the disclosed embodiments are flexible and scalable across entire data sets, both large and small, and may be used, for example, to identify and remove bad data from data streams, and to identify events of interest or of importance from within these data sets. At least some embodiments may identify different types of events. Thus, data sets within various domains may be analyzed. Identified events of interest which may be classified within known event types, and the collection of event metadata and underlying data references may be stored in a repository, such as a relational database. Higher level metadata descriptions of events can then be used to quickly respond to queries from users or applications and the information may be displayed in a visual format in one embodiment. One example framework allows analyses over complete large-scale power grid data sets generated by smart grid deployments which enable a more complete data analysis compared with analyzing subsets of data.

Referring to FIG. 1, one illustrative example of an electrical power system 10 is shown. Electrical power grids connect power producers and consumers through a complex network of transmission and distribution lines. Power producers use a variety of generator technologies, from coal to natural gas to nuclear and hydro, to create electricity. There are hundreds of large generation facilities spread across the United States, with many smaller facilities. Power is transferred from the generation facility to the transmission network, which moves it to where it is needed. The transmission network is comprised of high voltage lines that connect the generators to distribution points. The network is designed with redundancy, which allows power to flow to most locations even when there is a break in the line or a generator goes down unexpectedly. At specific distribution points, the voltage is decreased and then transferred to the consumer.

More recently, there has been increased interest in renewable energy. While there are many advantages to the development of renewable energy sources, they provide unique challenges to grid stability due to their unpredictability and connection to the distribution network in some arrangements as opposed to the transmission network of the electrical power grid.

To address these needs, power companies are looking towards a number of technology solutions. One potential solution being considered is transitioning to real-time pricing of power where the distribution system supports and provides real-time recording of power consumption. As mentioned previously, sensors may be utilized to monitor operations of an electrical power grid and the sensors may assist with a transition to a real-time pricing system since some sensors are capable of providing real-time consumption information in the form of time series data in one embodiment. For example, on the transmission side, existing sensors provide operators with the status of the grid every 4 seconds. However, some sensors, such as Phasor Measurement Units (PMUs), provide information 30-60 times per second. These sensors are time synchronized to a global clock so that the state of the grid at a specific time can be accurately reconstructed. It is apparent that the use of hundreds, thousands or tens of thousands of these sensors results in the generation of a significant amount of time series data which may be collected and processed.

In the depicted example, an electrical power grid is coupled with a plurality of electrical sources 14 (e.g., generators, renewable energy sources, etc.) and a plurality of electrical loads or consumers 16 (e.g., residences, businesses, etc.). The illustrated arrangement of the electrical power grid includes a transmission network 17 and a plurality of distribution networks 19 to conduct electrical energy from electrical sources 14 to consumers 16.

The illustrated electrical power system 10 also includes a plurality of sensors 18 which monitor the electrical power system 10 including the flow of electrical energy within and/or with respect to the electrical power system 10. Sensors 18 may be individually configured to monitor electrical energy flowing within a respective conductor of the electrical power system 10 in one embodiment.

In one embodiment, sensors 18 are phasor measurement units (PMUs) which monitor the electrical power system 10 and many reside at various substation locations on the electrical power grid. PMUs may monitor and record variables or characteristics, such as the grid frequency, voltage, current, and phase angles at very high time resolution. Other variables include special flags indicating the state of a given PMU and location-specific meta-data useful for transforming the raw measurements into meaningful values.

In one embodiment, PMUs are time-synchronized, so that measurements at different locations can be lined up in time. Frequency is a measure of the cycles per second of current flowing through a wire and is of interest for many of the example exploratory data analysis operations performed upon large-scale data sets which are discussed below.

One example large-scale data set was obtained by monitoring operations of 38 PMUs for 1.5 years which resulted in about 1.5 billion time points at which measurements were taken. An example PMU may contain from 2 to 10 phasors measuring voltage or current phasor information at different buses. Thus, a single PMU can report up to 30 billion records over this time period resulting in a size of approximately 1.9 TB in a binary format. PMU data is expected to grow significantly in the coming years and it is reasonable to expect that utilities will regularly require analysis over data sets of this size or larger. However, definite challenges are presented to process and analyze data sets of this example size or larger using existing analysis methods. Details of regarding example methods and apparatus for processing large-scale data sets are described below. Large-scale data sets may be characterized by either raw data set size (e.g., in excess of 1 TB) or number of records (e.g., over 1 billion records). These data sets are too large to be analyzed in memory on a typical server, and typically specialized hardware and software analysis techniques are used to process the large-scale data sets.

Figure 2:
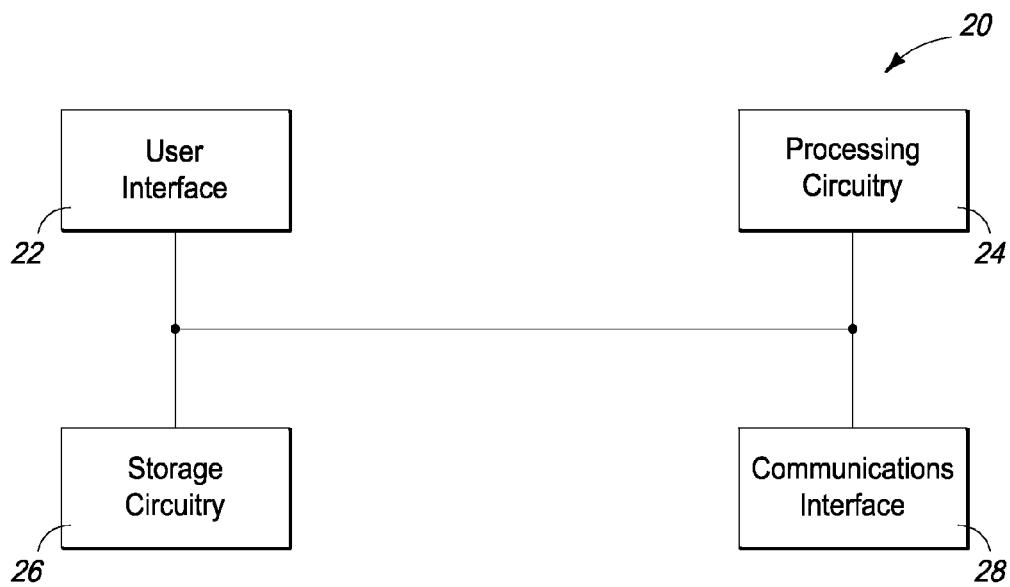
FIG. 2 is a functional block diagram of a computing system according to one embodiment.

Referring to FIG. 2, one embodiment of a computing system 20 configured to implement processing and analysis operations is shown. In one example described herein, the computing system 20 is configured to implement exploratory data analysis upon large-scale data sets. In the illustrated example embodiment, computing system 20 includes a user interface 22, processing circuitry 24, storage circuitry 26, and a communications interface 28. Other embodiments of computing system 20 are possible including more, less and/or alternative components.

User interface 22 is configured to interact with a user including conveying data to a user (e.g., displaying visual images, graphs, processing results, etc. for observation by the user) as well as receiving inputs from the user, including commands to direct exploratory data analysis of a data set in one embodiment. User interface 22 is configured as a scripting user interface in one example and may be configured differently, for example as a graphical user interface or command line interface, in other embodiments.

In one embodiment, processing circuitry 24 is arranged to process and analyze data, control data access and storage, issue commands, and control other desired operations. Processing circuitry 24 may comprise circuitry configured to implement desired programming provided by appropriate computer-readable storage media in at least one embodiment. For example, the processing circuitry 24 may be implemented as one or more processor(s) and/or other structure configured to execute executable instructions including, for example, software and/or firmware instructions. A plurality of processors may operate in parallel in some distributed parallel processing implementations. Other example embodiments of processing circuitry 24 include hardware logic, PGA, FPGA, ASIC, state machines, and/or other structures alone or in combination with one or more processor(s). These examples of processing circuitry 24 are for illustration and other configurations are possible. Additional details regarding example configurations which are configured to process large-scale data sets are described below.

Storage circuitry 26 is configured to store programs such as executable code or instructions (e.g., software and/or firmware), electronic data, databases, a metadata repository, or other digital information and may include computer-readable storage media. A plurality of storage components may operate in parallel in some embodiments. At least some embodiments or aspects described herein may be implemented using programming stored within one or more computer-readable storage medium of storage circuitry 26 and configured to control appropriate processing circuitry 24.

The computer-readable storage medium may be embodied in one or more articles of manufacture which can contain, store, or maintain programming, data and/or digital information for use by or in connection with an instruction execution system including processing circuitry 24 in one embodiment. For example, computer-readable storage media may be non-transitory and include any one of physical media such as electronic, magnetic, optical, electromagnetic, infrared or semiconductor media. Some more specific examples of computer-readable storage media include, but are not limited to, a portable magnetic computer diskette, such as a floppy diskette, a zip disk, a hard drive, random access memory, read only memory, flash memory, cache memory, and/or other configurations capable of storing programming, data, or other digital information.

Communications interface 28 is arranged to implement communications of computing system 20 with respect to both internal and external devices while providing communication among components of the computing system 20. The interface 28 also supports access to external sensors and data sources, such as PMU sensors, files containing PMU data and other internet based information. Communications interface 28 may be arranged to communicate information bi-directionally with respect to computing system 20. Communications interface 28 may be implemented as a network interface card (NIC), serial or parallel connection, USB port, Firewire interface, flash memory interface, or any other suitable arrangement for implementing communications with respect to computing system 20.

Some aspects of the disclosure describe framework examples of hardware and software which may be used to perform comprehensive exploratory data analysis at scale. The described example computing system 20 provides an interactive environment which enables analysts to flexibly and rapidly develop and update algorithms, methods, and visualizations, and to apply these algorithms at scale relative to the data and receive results in a reasonable amount of time.

Computing system 20 is configured differently in different embodiments including, for example, a Hadoop cluster or a queue-based high performance computing (HPC) cluster. In illustrative embodiments, these configurations may be used for iterative large-scale data analysis. Computing system 20 is flexible to provide resources available on demand and a traditional Hadoop cluster setup allows for both on-demand compute resources and persistent, always-accessible storage in one implementation.

In one embodiment, storage circuitry 26 utilizes a Hadoop Distributed File System (HDFS), and on-demand computing is facilitated by Hadoop's inherent multi-user architecture through job and task scheduling. In one example for a queue-based high performance computing (HPC) cluster, the storage circuitry 26 may be implemented as a persistent, high performance, distributed file system.

In one embodiment, processing circuitry 24 is implemented using a plurality of compute nodes which have a high throughput network connection to the file system and thus can theoretically access the data at speeds comparable to the data residing on local disk. Individual compute nodes have 32 processor cores in one example configuration and may independently process the large-scale data sets in parallel.

It is desirable in some embodiments to provide analysts with the ability to rapidly prototype data analysis routines to provide reasonable interactivity with the data. In addition, some embodiments described below implement exploratory data analysis at scale, for example, upon numerous records (e.g., billions of data records).

The R statistical computing environment is a good candidate for addressing the need of rapid prototyping of data analysis routines. As a high-level language, it is flexible and allows for rapid development. R has excellent statistical visualization capabilities for exploratory analysis, data integrity checking, and model diagnostics. It is particularly well suited for exploratory data analysis. Along with these capabilities, R has a great wealth of statistical routines available, and over 4000 user contributed packages (see Comprehensive R Archive Network at cran.r-project.org).

MapReduce using Hadoop is applied in one embodiment to achieve scale. MapReduce is a powerful programming model for breaking a task into pieces and operating on those pieces in a parallel manner across a cluster. Additionally, MapReduce provides a versatile high-level parallelization to solve many data-intensive problems through use of user-specified Map and Reduce functions (see J. Dean and S. Ghemawat, MapReduce: Simplified Data Processing on Large Clusters, *Communications of the ACM*, 51(1):107-113, 2008, the teachings of which are incorporated herein by reference). MapReduce algorithms operate on data structures represented as key/value pairs. The data is split into blocks and each block is represented as a key and value. Typically the key is a descriptive data structure of the data in the block, while the value is the actual data for the block.

A MapReduce job begins by taking the input data, which is a collection of the key-value pairs, and applying a map function to each input of the key/value pairs independently in parallel. Each call of the map function outputs a transformed key-value pair. All values associated with a unique map output key are grouped together and processed by a reduce function, which produces a collection of output key-value pairs. Other embodiments apart from MapReduce may be utilized.

Figure 3:
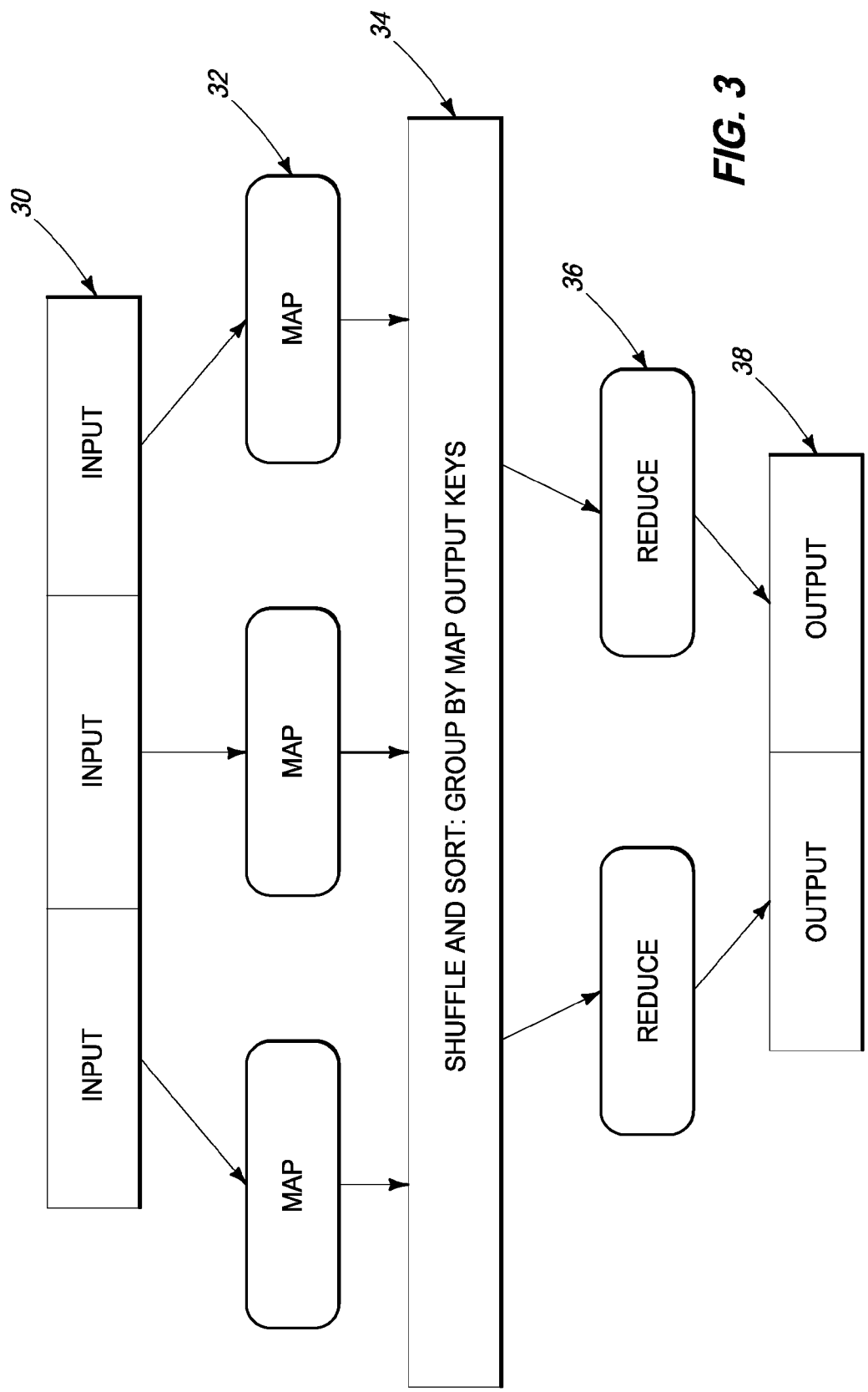
FIG. 3 is a functional block diagram of a MapReduce paradigm according to one embodiment.

Referring to FIG. 3, a MapReduce paradigm for iterative processing of large-scale data sets is shown according to one embodiment. More specifically, the MapReduce model is comprised of map and reduce phases which operate as described below.

Input of the data in the form of a plurality of key/value pairs 30 is accessed. A map function 32 to implement user-defined processing is applied to each input key/value pair emitting new key/value pairs to intermediate storage to be processed by the reduce. A shuffle/sort operation 34 is provided where the map output values are collected for each unique map output key and passed to a reduce function 36. The reduce function 36 is applied in parallel to all values corresponding to each unique map output key and emits a plurality of output key/value pairs 38.

The MapReduce paradigm may be utilized for a wide class of statistical computations, and particularly for exploratory data analysis where analysts are mainly interested in investigating behaviors and relationships within and between variables at various levels of granularity. For data large and small, it is often the practice to investigate statistical properties of the data broken down by conditioning variables. Conditioning variables create natural subsets of the data over which the application of MapReduce calculations may be facilitated.

If subsets created by conditioning variables are too large, or if conditioning schemes are being explored that are different from the setup of the input data key-value pairs, the computation can be applied by making the correct key-value transformations in the map function and breaking down the algorithms to work in a divide and recombine framework. Several examples of MapReduce algorithms for common statistical methods are discussed in C. T. Chu, S. K. Kim, Y. A. Lin, Y. Y. Yu, G. Bradski, A. Y. Ng, and K. Olukotun, Map-reduce for Machine Learning on Multicore, *Advances* in *Neural Information Processing Systems,* 19:281, 2007, the teachings of which are incorporated herein by reference.

Furthermore, the R programming environment facilitates coding of ad-hoc MapReduce algorithms for exploratory data analysis. A typical approach to writing a map and a reduce is to first focus on getting the analysis and code to run correctly on a small subset of the data (e.g., 5-minute block of data). Once this is done, scaling it up to the entire data set is a matter of specifying the entire data set as the input.

Hadoop is an open-source distributed software system for writing MapReduce applications capable of processing vast amounts of data, in parallel, on large clusters of commodity hardware, in a fault-tolerant manner. It consists of the Hadoop Distributed File System (HDFS) and a MapReduce parallel compute engine. Hadoop handles data by distributing key/value pairs into the HDFS. Hadoop schedules and executes the computations on the key/value pairs in parallel, attempting to minimize data movement. Hadoop handles load balancing and automatically restarts jobs when a fault is encountered. Once a MapReduce algorithm is written, Hadoop provides concurrency, scalability and reliability. In one specific example, a Hadoop implementation of MapReduce supported by the Apache Software Foundation is implemented (see Hadoop, http://hadoop.apache.org).

The R-Hadoop Integrated Processing Environment (RHIPE) is an open-source effort, providing an R interface to Hadoop, that enables an analyst of large data to apply numeric or visualization methods in R. Data analysts write MapReduce code in R to be processed by Hadoop (see RHIPE, http://www.rhipe.org). Integration of R and Hadoop is accomplished by a set of components written in R and Java. The components handle the passing of information between R and Hadoop, making the internals of Hadoop transparent to the user. The combination of R and Hadoop provides scalability and promotes detailed, comprehensive analysis for exploratory data analysis and knowledge discovery in massive databases, and ultimately lets the user focus on analysis of the data. This interface hides much of the complexity of running parallel analyses, including many of the traditional Hadoop management tasks. Further, by providing access to standard R functions, RHIPE allows the analyst to rapidly prototype methods and algorithms and focus on the analysis instead of code development, even when exploring large data sets. Additional details, including information about installation, job monitoring, configuration, debugging, and advanced options, are described in www.rhipe.org and White, T., *Hadoop: The Definitive Guide,* 2010, the teachings of which are incorporated herein by reference.

In one illustrative example, a job in an HPC cluster may be launched by running a script that allocates the nodes, moves Hadoop to each node, and starts Hadoop. This process requires only a matter of seconds and therefore does not add much tedium to an interactive analysis requirement. Once the Hadoop cluster-on-demand is running, the analyst logs in to the namenode, launches R, loads the RHIPE package, and runs the desired MapReduce job in an interactive environment. Upon job completion, the nodes are released and the results may be analyzed in a local workstation R session. If the MapReduce output is large, subsequent MapReduce analyses may be run on the output data.

In one example application, apparatus and methods of the disclosure are utilized to analyze data from the electrical power grid domain using large-scale data analysis. Large-scale data sets of 2 TB of data or more are used for analysis in some applications.

Problems are presented with generation of data sets of this magnitude and scale as previous algorithms used for analyzing data do not scale well to these new data sets. Furthermore, without comprehensive analysis, it is not clear what new insights can be gleaned from this more refined available data.

At least some aspects of the disclosure are directed towards processing significant amounts of data regarding electrical power systems, including apparatus and methods for developing scalable algorithms for known events as well as enabling additional investigation into the data sets using techniques such as exploratory data analysis.

In exploratory data analysis, an analyst may have a general idea of what they are looking for but not a specific description or model that can identify that general concept. For example, the analyst may suspect that identifying abnormal frequency events in an electrical power system may be beneficial, however, the parameters of an algorithm to properly detect the events may not be known. A data set may be initially processed visually, statistically, and numerically using these initial ideas. The original ideas may be updated and the investigation of the data may be continued in an iterative process to develop and update models (e.g., filters and event detectors) of interest for processing data sets. These aspects of the disclosure providing an iterative exploratory data analysis enable an analyst to flexibly and rapidly develop and update algorithms (e.g., filters and event detectors), methods and visualizations as well as apply the algorithms to the data set at scale and receive results in a reasonable amount of time.

In exploratory data analysis, an analyst starts with an initial problem they are trying to solve. In one example, a problem may be the identification of bad (erroneous) data in the data set (however, the bad data is not clearly known initially) and then filters may be generated to remove the bad data. An analyst may define a model that is designed to give them insight into what is happening in the data. That model may not actually be a filter, however. For example, it could be generating a set of statistics over the data to get a better idea of what is happening across the data set, or in a particular region of interest.

Running the model over the data set gives the analyst insight into which subsets of the data are of particular interest. From there, the analyst may analyze the results—perhaps identifying a subset of data for further analysis, perhaps refining the model, perhaps adjusting the initial problem definition based the results of the initial analysis. This process may be repeated in an iterative method until the analyst has a model or set of models that address the problem they are trying to solve.

The exploratory aspect of this approach is beneficial in examples discussed below since it was not known exactly what types of errors were present. The iterative aspect of the approach may allow the analyst to refine the filters until they captured the dominant data errors.

Figures 4, 5:
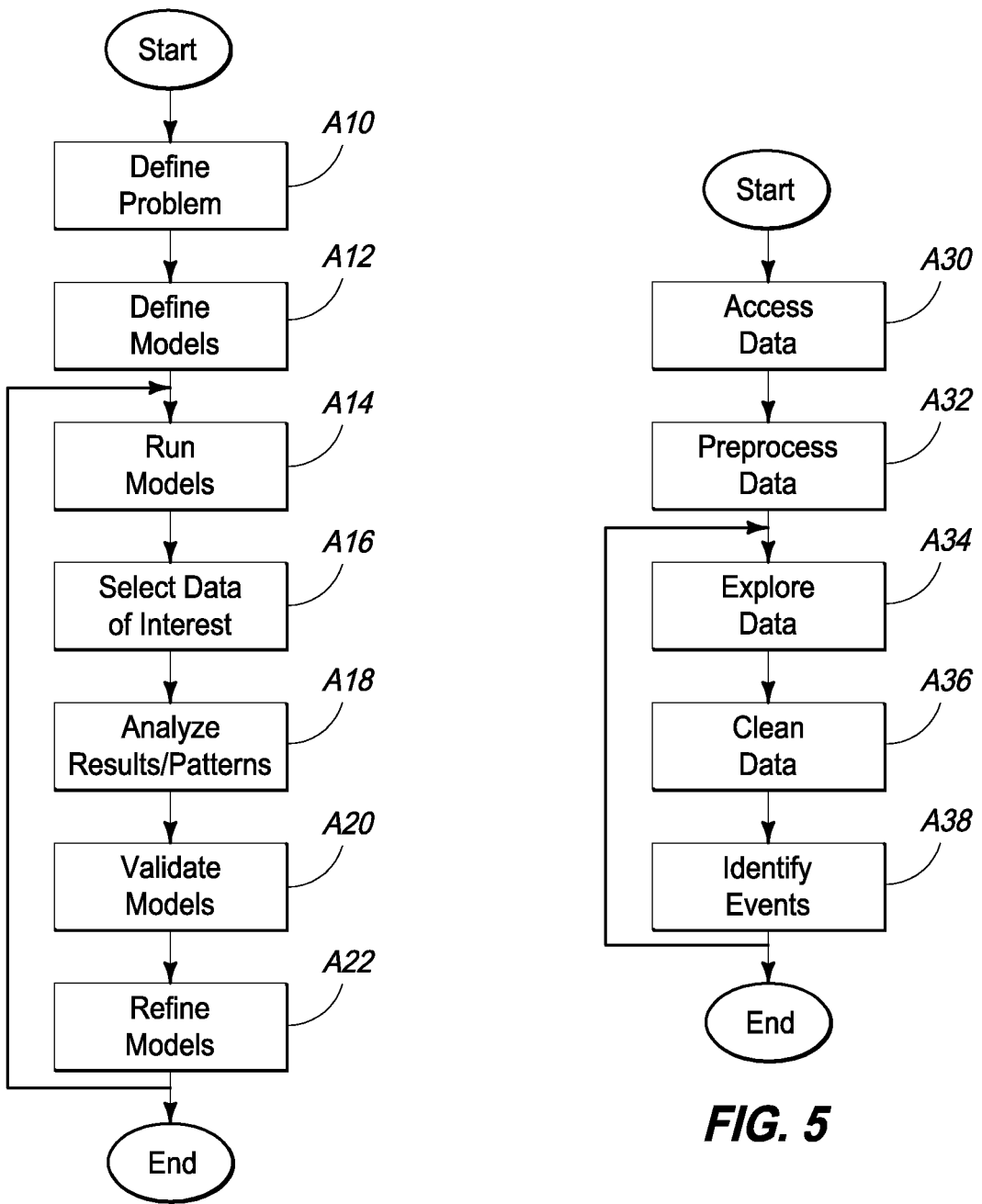
FIG. 4 is a flow chart of a method of creating models according to one embodiment.
FIG. 5 is a flow chart of a method of processing a data set to identify events of interest according to one embodiment.

Referring to FIG. 4, an example method for developing models (e.g., algorithms in the form of filters and/or event detectors) for processing a significant amount of data, such as data generated by thousands of sensors in the electrical power grid domain, is described. In one embodiment, the method of FIG. 4 may be applied across a data subset (e.g., 5-minute window) of a large-scale data set to develop the models which may be subsequently applied to the same or different large-scale data set. In one example, filters may be developed to clean the data subset prior to analysis of the data subset to develop event detectors. Thereafter, the developed filters and event detectors may be subsequently utilized to clean data and to detect events of interest in data sets of interest (e.g., large-scale data sets, streams of real-time data) of an electrical power grid. Other methods are possible including more, less and/or alternative acts.

At an act A10, a problem is initially defined. For example, as with many sensor data sets, erroneous records may be present in the data. Accordingly, it is desirable to identify and filter bad data records. Thereafter, exploratory data analysis may be performed upon the data set to identify events of interest.

A variety of analysis techniques including summary statistics, distribution checking, autocorrelation detection, and repeated value distribution characterization may be utilized to identify bad records and verified by exploratory data analysis. Algorithms may be written to manage, explore, clean, and apply basic feature extraction routines over the data set. Once the data set has been cleaned, meaningful events can be extracted. For example, events that result in a network partition or isolation of part of the network (i.e., power grid) are of interest to power engineers.

At an Act A12, filters and/or event detectors may be generated to approach the identified problem, such as developing filters to clean a data set and/or developing event detectors to identify events of interest in a data set. In one example, exploratory data analysis may be used to identify (and create filters for) different categories of bad data and develop event detectors as discussed further below. Furthermore, the data may be preprocessed prior to the use of the data for development of the filters and/or event detectors in one embodiment as discussed in further detail below with respect to act A32 of FIG. 5.

At an Act A14, the filters and/or event detectors are run against the data set. For example, the filters may identify and/or remove portions of the data and event detectors may identify events of interest.

At an Act A16, subsets of the data being analyzed may be selected. For example, in one filter example, data which was identified as bad in act A14 may be selected. Furthermore, different subsets of data may be selected and utilized during different iterations of the process.

At an Act A18, the selected subsets of data may be analyzed for results and/or patterns. In one filter example, the parameters of the filter may result in too much or too little information being identified as bad.

At an Act A20, it is determined whether the filter or event detector may be validated as a result from analyzing the data. If so, the developed filters and/or event detectors may be subsequently used to process, for example using exploratory data analysis, data sets of interest including large-scale data sets and real time streaming data. In one embodiment, the filters and/or event detectors may be applied to the large-scale data set to perform the validation.

If not, the method may proceed to an act A22, where the filter or event detector may be refined. Referring again to the filter example, the parameters may be adjusted to reduce or increase the amount of data which is identified as being bad and perhaps filtered. In another example, event detectors may be tailored to refine the events which are detected. Thereafter, the acts of A14-A22 may be repeated in an iterative process until the filter or event detector is acceptable and validated.

Additional details regarding performing exploratory data analysis upon large-scale data to identify, refine and utilize filters and event detectors are described below in illustrative examples with respect to electrical power systems.

Referring to FIG. 5, an example method for processing a large-scale data set using exploratory data analysis is described according to one embodiment. Other methods are possible including more, less and/or alternative acts.

At an act A30, a large-scale data set is accessed. In illustrative embodiments, the data set of FIG. 5 may be the same or different from the data set which included the data subset which was utilized to generate the filters and/or event detectors of FIG. 4.

At an act A32, the raw data of the large data set may be initially preprocessed to make it more suitable for analysis, including implementations where MapReduce is utilized. As mentioned above, some methods and apparatus of the disclosure may process data sets of significant size. In one electrical power domain example, the raw data of the data set consists of about 157,000 binary format files, each typically spanning a 5-minute time interval.

In one embodiment, the data may be partitioned into key/value pairs in a way that makes the resulting analysis efficient. This applies to both optionally reformatting the original data into a format that can be manipulated by R and partitioning the data in a way that supports the analyses to be performed. In general, it is not uncommon to partition the data along multiple dimensions to support different analyses.

A first step is to convert the raw data into a format that can be quickly ingested by R in one embodiment. For example, converting data of a binary file into an R data frame dramatically reduces read times for subsequent analyses. The raw PMU data may be provided in a binary format that uses files to partition the data. The data may be initially read into a serialized format with a MapReduce job with the output being key-value pairs in a Hadoop sequence file, with the key being the file name and the value being a matrix of the data corresponding to that file. In one illustrative example, each file typically contains approximately 9000 records, representing 5 minutes of data and each record contains a plurality of variables representing the time and multiple measurements for each sensor.

A major consideration when partitioning the data is determining how to best split it into key/value pairs. The example analyses discussed herein was primarily focused on time-local behavior due to the interconnected nature of the electrical power system being analyzed, and therefore the partitioning of the data into subsets of 5-minute time intervals is appropriate. 5 minutes is an appropriate size for analysis because interesting time-local behaviors occur in intervals spanning only a few seconds, and the blocks are of an adequate size (~11 MB per serialized block) for multiple blocks to be read into the map function at a given time. Further, the files may be configured to overlapping time intervals. Many raw data files do not contain exactly 5 minutes of data, so some additional preprocessing may be used to fill in missing information for individual 5-minute subsets (although subsets of other size may be used in other embodiments).

In one example, contiguous time regions as a conditioning factor for data blocks may be used. While a 5-minute time window was selected in the described example, the raw data did not always follow the 5-minute rule and to make block-by-block calculations more comparable, a MapReduce job may be performed to push each observation into the closest 5-minute time block to which it immediately followed. For example, an observation that occurs at 2010-01-01 12:32:23.5 would be assigned to the group starting with time 2010-01-01 12:30:00.0. The 5-minute time as a numeric Unix time value was chosen to be the output key, with the associated data as the value.

If the analysis focuses on behavior of individual PMUs over time, the partitioning may be by PMU. This may result in too much data per partition and thus an additional refinement based on time or additional partitioning within PMU may be utilized.

The output of this MapReduce job is a Hadoop map file, which can be queried by key, so that raw data of interest can be easily and quickly retrieved by date and time. To keep the data compact, frequency may be stored as an offset in thousandths from 60 Hz, as this is the finest resolution at which the data was reported in the described example. For example, a value stored as −1 corresponds to a frequency of 59.999 Hz. Furthermore, storing the data in this way allows the use of an integer instead of a floating-point number, which may greatly reduce the file size. The cost of making the conversion to Hz on each read is more than offset by faster I/O for a smaller file in one example.

At an act A34, the data may be visually, statistically, and numerically explored. The method of FIG. 4 may be implemented in act A34 to generate filters and/or event detectors for use in processing large-scale data sets in one embodiment.

With large data sets, exploration is often initially accomplished through summaries since an analysis of the detailed records directly can be overwhelming. While summaries can mask interesting features of the full data, they can also provide immediate insights. Once the data is understood at the high level, analysis of the detailed records can be fruitful.

As an initial exploratory task, summary statistics of the frequency for each PMU may be calculated at each 5-minute time interval. These statistics included the min, max, median, mean, variance, and number of missing values, and may be computed with a simple RHIPE map-reduce job in one embodiment. A simple summary of frequency over a 5-minute window for each PMU provides a good starting point for understanding the data. This calculation is straightforward since the data is already divided into 5-minute blocks the computation simply calculates summary statistics at each time stamp split by PMU. The data may be converted from the one-thousandth offset from 60 Hz to a true frequency value and a data frame of summary statistics may be calculated which is emitted to the reduce function with the PMU as the key. This map task emits key/value pairs (one for each PMU) for each input key (time interval). Review of the summary statistics may lead an analyst to further investigate several bad data possibilities.

In one example using real data, analysis of the 5-minute subsets highlighted some interesting behaviors in the frequency. Specifically, the frequency data may be plotted in Quantile plots which revealed that some PMUs exhibit extended periods of abnormally deviant median frequencies, and more interestingly, these aberrant points typically have few values reported for the 5-minute interval.

With RHIPE in one example, an analyst can perform calculations across the entire data set to uncover and confirm the bad data cases while developing algorithms for removing these cases from the data. A conservative approach filters only impossible data values, ensuring that anomalous data is not unintentionally filtered out by these algorithms. Furthermore, the original data set is unchanged by the filters, which are applied on demand to remove specific types of information from the data.

In one example of processing data from an electrical power system, a number of behaviors were identified as being indicative of bad data. For example, an initial analysis reviewed flags generated by PMUs to attempt to identify bad data. Each PMU at each time point reports a flag indicating the status of the measurement at that time in one embodiment. In one example, one or more certain flags may be used to indicate a bad data point being recorded as a certain frequency. When a bad data flag is present, the corresponding frequency value is reported as a fixed number.

Quantile plots of the 5-minute medians exhibited a number of PMUs for which the frequency/flag occurred much more frequently than for other PMUs (e.g., over 40% of the observations). A subsequent examination of the distribution of frequency values for each PMU and each flag may be performed by tabulating the discrete frequency offset values for the distribution calculation via a RHIPE MapReduce job where for each unique PMU and flag in each block, the map task tabulates the frequency values and emits the PMU and flag as the key and the tabulated frequency corresponding to that flag as the value. The reduce task collects the tables for each unique key and combines them.

The results may be plotted to show the distribution of frequency deviation by flag for each PMU. For a given PMU, other flags may be indicative of bad data, and in one example, three other flags were identified for which effectively all observations from the PMU are indicative of bad data. Accordingly, a filter may be developed to remove data associated with flags which have been identified as being associated with bad data.

Another case of bad data was discovered by plotting the 5-minute frequency summary values across time. In these plots, some PMUs exhibit patches of data with many extreme outliers. The number of missing values across time for each PMU were plotted and revealed that there appeared to be a correspondence between large numbers of missing values and very large outlying frequency values. To illustrate this relationship, a hexbin plot may be used which tessellates the plot region by a regular grid of hexagons and colors them according to how many points fall into each hexagon, which allows for scatterplot visualization when the number of points is extremely large. This plotting reveals some PMUs yield very large deviations from 60 Hz only when the 5-minute time window has nearly all missing values. A physical interpretation of this could be that a PMU that is only sporadically emitting data is not very trustworthy. Accordingly, a filter may be developed to remove data from a given PMU which has a certain threshold number of missing values in one embodiment.

Further analysis of the data revealed some PMUs providing an unusually high number of zero values, both in Quantile plots and frequency distribution plots. Further analysis of the raw data revealed what appeared to be abnormally long sequences of repeated zeros. The frequency signal should be changing rapidly over time and thus should not remain consecutively at zero for very long, and thus long sequences of repeated zeros are suspect. The distribution of the run length of repeated zeros for each PMU was calculated in one example. An exact calculation of this would allow sequences to span multiple 5-minute time windows. While such a calculation is possible by overlapping the data in time in MapReduce, a simple calculation route of tabulating zero run lengths may be utilized within each 5-minute time block for an approximate distribution. In one example, one of the parameters of a filter to detect this data comprises a threshold of a length of time for a frequency provided by a phasor measurement unit (PMU) to be non-varying and indicative of a type of the erroneous data. In one more specific example, a filter may indicate data as being bad as a result of the presence of a run length exceeding a threshold (e.g., at least 800 points corresponding to 26 seconds). An appropriate value of the threshold may be determined using iterative analysis upon the data in one embodiment.

Additional analysis of the data revealed additional bad data where one PMU reports what appears to be white noise indicative of bad data while the other PMUs are reporting valid data. To remove white noise data, a filter may be created that calculates the sample autocorrelation function (ACF) of the frequency time series within each 5-minute time subset. A non-stationary time series has an ACF that starts at 1 and trails off very slowly, while white noise has non-significant autocorrelation at any non-zero lag, with the autocorrelation fluctuating around zero. The filter may look for any negative sample ACF values out to the first 50 lags, and if such a value exists, the series in that time window does not have the ACF characteristics of normal frequency data. Other tests for this phenomenon could be constructed, such as the variance of the data around a fitted line.

As described in the method of FIG. 4, the filters may be applied to data, results analyzed, and the filters may be refined and validated.

At an act A36, once the filter(s) are developed (e.g., using a data subset of a large-scale data set as described above), refined and validated (e.g., upon the large-scale data set), they may be utilized to clean a data set of interest to be analyzed (e.g., a large-scale data set or streaming real-time data sets) prior to such analysis, for example to identify additional models or events of interest as discussed below.

With respect to electrical power systems, one type of interesting behavior occurs when the difference between time-synchronized frequency for two locations is significantly high. In general, the frequency at different locations typically behaves in the same way. In order to determine what signifies a significant frequency deviation between two frequencies, the distribution of the difference between all pairwise combinations of PMUs may be analyzed. The calculation of statics of the differences may be implemented in MapReduce using RHIPE in a straightforward manner, since instead of a simple tabulation of data by a conditioning variable, transformation of the input data into pairwise groupings may be performed prior to performing calculations. This example analysis revealed that certain pairs have a very tight distribution at the lowest end where some time-synchronized pairs are within 1/1000th of each other 99% of the time, while other pairs have significant frequency differences. Further investigation revealed that some of the increased differences were due to geographical or electrical distance between the PMUs. In one example, the median and standard deviation of the 99th percentile were calculated at each 5-minute interval of the pairwise differences to choose limits beyond which frequency differences are deemed to be significant and not due to geographical or electrical distances.

At an act A38, an event detector may be utilized to find events of interest in the data set of interest. In some embodiments, a plurality of models (filters and event detectors) may be applied to the data in a sequence. Thereafter, the acts of A34-A38 may be repeated in an iterative process. Furthermore, the models may be also further refined or new models developed during the application of the models to analyze the data sets of interest.

In one example, an event detector may find cases when any pairwise difference at any time point exceeds the specified limit for that pair. To narrow down the field of results, an additional constraint that the difference must remain of the same sign for a specified amount of time (e.g., 3 seconds), so that only results of persistent deviations will be returned. A MapReduce job may be used to take each PMU pair and look at the frequency difference for sequences matching these criteria, and outputting data when events were found. Using the example electrical power system data, the algorithm returned 73 events which can be mostly grouped into 6 categories with representative events of each shown in FIGS. 6-6E where the time scales in the sub-minute range on the x-axis are labeled in units of seconds (e.g. 00, 15, etc.), and when the event spans multiple minutes, the x-axis is expressed as time (e.g. 16:45). The y-axis frequency labels are omitted in interest of space but are comparable for each event, and it is the patterns in the plots that are interesting.

As discussed herein, the electrical power grid is a large, connected, synchronized machine. As a result, the frequency measured at any given time should be nearly the same irrespective of location. If frequency at one group of locations is different from another group of locations for a prolonged amount of time, there may be islanding of the grid in which a portion of the grid is disconnected from the rest, resulting in a network "island". This is one example an out-of-sync (OOS) frequency event, a general term for events where sensors appear to be measuring disconnected networks.

Finding significant differences between two PMU data streams requires first characterizing a "typical" difference. The distribution of all pairwise frequency differences between PMUs was calculated, and the upper quantiles of these distributions were defined as the cutoffs beyond which the difference is significant. The variability of the frequency difference between two locations is greater when the locations are geographically farther apart. As a result, in practice, the cutoff value for significant PMU pair differences varies. For simplicity, a fixed cutoff of 1/100 HZ may be used.

To find regions where there is a significant, persistent difference between frequency for different PMUs, all pairwise differences are considered using the following map expression in one embodiment:

```
map.oos <- rhmap({
    colNames <- colnames(r)
    freqColumns <- which(grepl("freq", colNames))
    pmuName <- gsub("(.*)\\.freq", "\\1", colNames[freqColumns])
    # make r only contain frequency information
    tt <- r$time
    r <- r[,freqColumns]
    names(r) <- pmuName
    # get all combinations of pairs
    freqPairs <- combn(ncol(r), 2)
    freqPairNames <- rbind(
        names(r)[freqPairs[2,]], names(r)[freqPairs[1,]]
    )
    # loop through all pairs and look for significant differences
    for(i in 1:ncol(freqPairs)) {
        s1 <- freqPairs[1,i]
        s2 <- freqPairs[2,i]
        isSignif <- ifelse(abs(r[,s1] - r[,s2]) > 10, 1, 0)
        changeIndex <- which(diff(isSignif) != 0) # find index of
        changes
        changeIndex <- c(0, changeIndex, length(isSignif)) # pad
        runLengths <- diff(changeIndex) #  run  length  is  diff
        between changes
        runValues <- isSignif[changeIndex[-1]]
        # we are interested in 1's that repeat more than 90 times
        signifIndex <- which(runValues == 1 & runLengths > 90)
        for(ix in signifIndex) {
            rhcollect(
                freqPairNames[,i],
                data.frame(time=tt[changeIndex[-1][ix]],
        length=runLengths[ix])
            )
        }
    }
})
oosFreq <- rhwatch(
    map=map.oos,
    reduce=reduce.rbind,
    input="blocks5min",
    output="frequency_outofsync"
)
```

The combn( ) function generates all combinations of PMU names. The absolute difference between the frequency series is calculated for each pair and checked to see if there is a persistent significant difference between the two. Three seconds (90 records) was chosen to represent "persistent" although this can be adjusted. If there is a significant difference, the beginning time of the run and the run length is emitted to provide data that can be used as the basis for further investigation. The reduce.rbind expression collects the results into a single data frame for each PMU pair.

Figure 6:
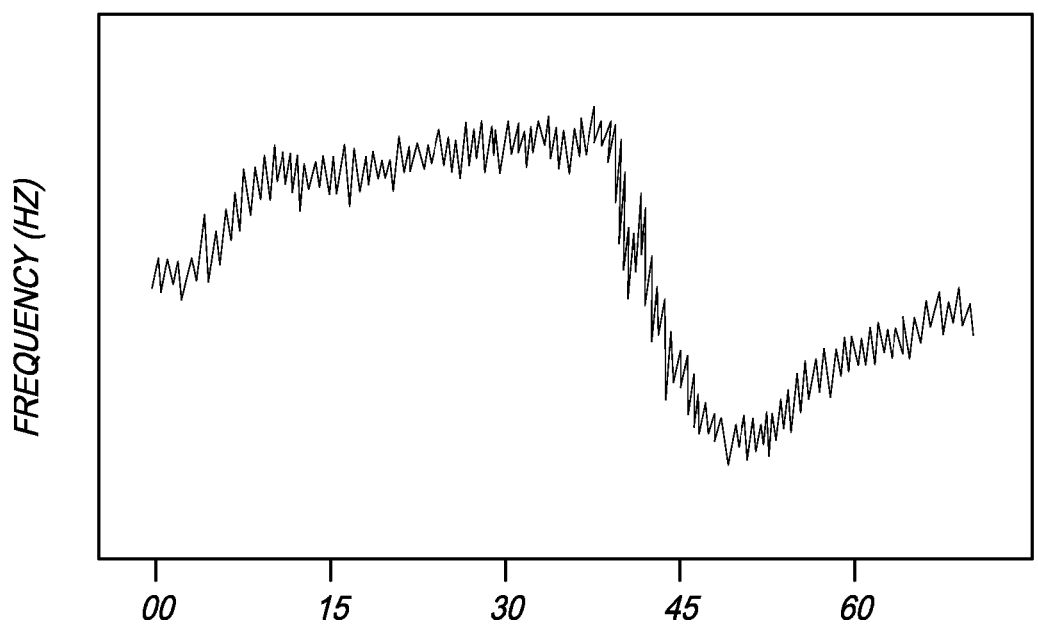
FIGS. 6-6E are graphical illustrations of events of interest detected by analyzing data of an electrical power system according to one embodiment.

FIGS. 6, 6A, 6B, and 6E are examples of patterns that were found multiple times in analysis of the example data. The event of FIG. 6 is an example of a generator trip. When a generator trip occurs, the effect is a sudden drop in the frequency across the grid, which gradually returns to a stable state after automated controls kick in. The application of the event detection algorithm uncovered many generator trip events because the opposing oscillations of groups of PMUs that it can cause meet the rules of the algorithm.

Figure 6A:
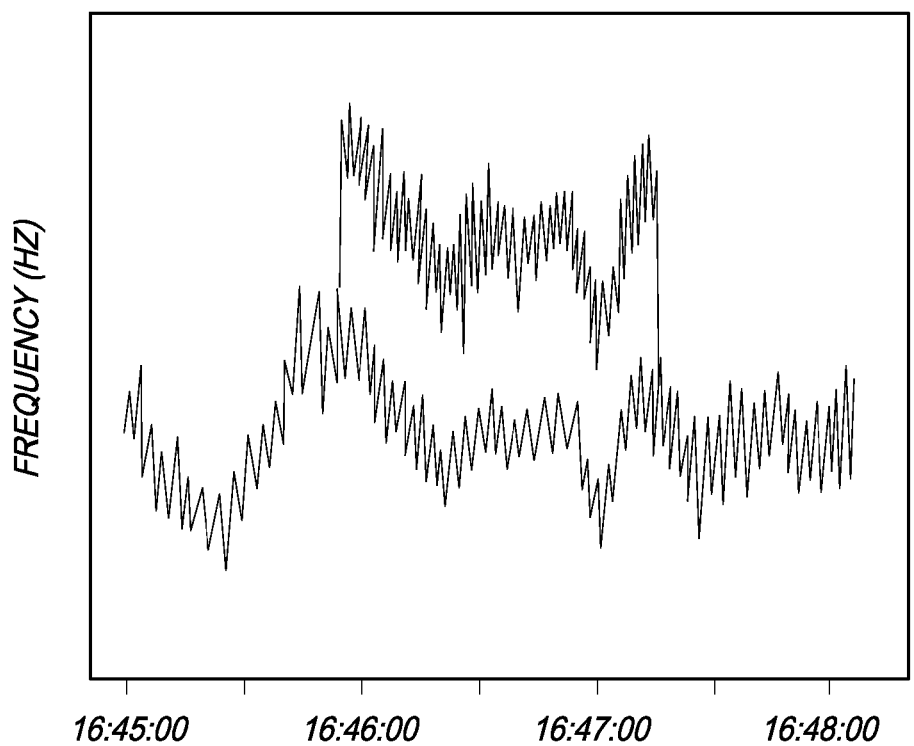

The general pattern in FIG. 6A occurred many times in the analysis example. This is characterized by one PMU jumping off from the pack and following the general shape of the others with just a positive or negative offset. Typically a frequency disturbance at one location impacts the frequencies at all other locations, which may indicate that this type of event is a more sophisticated "bad data" case. However, this is an example of identified data which may be sufficiently unique to warrant extra scrutiny, perhaps to develop an event detector to detect these events, perhaps for analysis of data occurring in real-time.

Figure 6B:
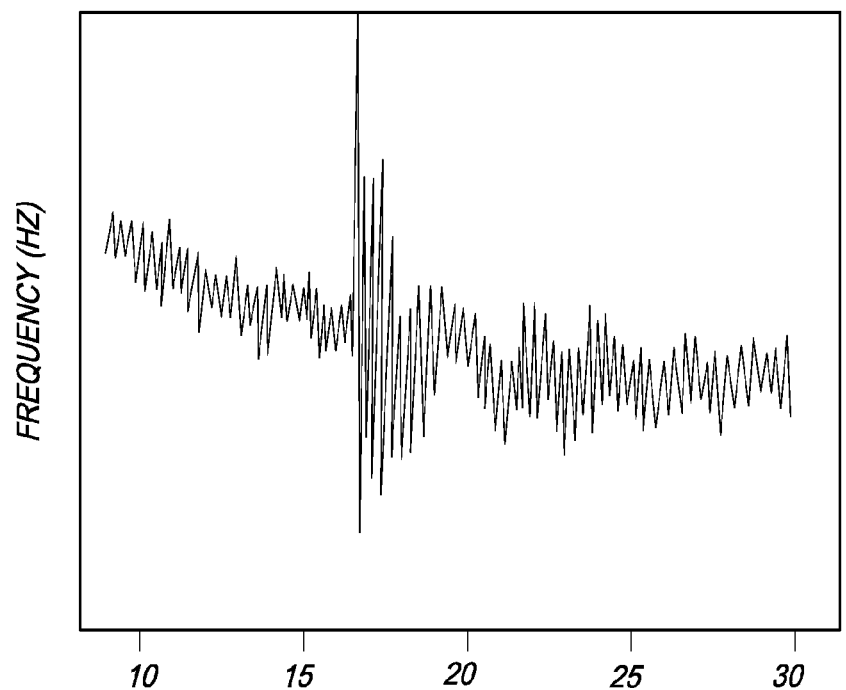

FIG. 6B shows an event characterized by a spike in activity (the spike well exceeds the plot region) followed by opposing oscillatory behavior for different groups of PMUs.

Figure 6C:
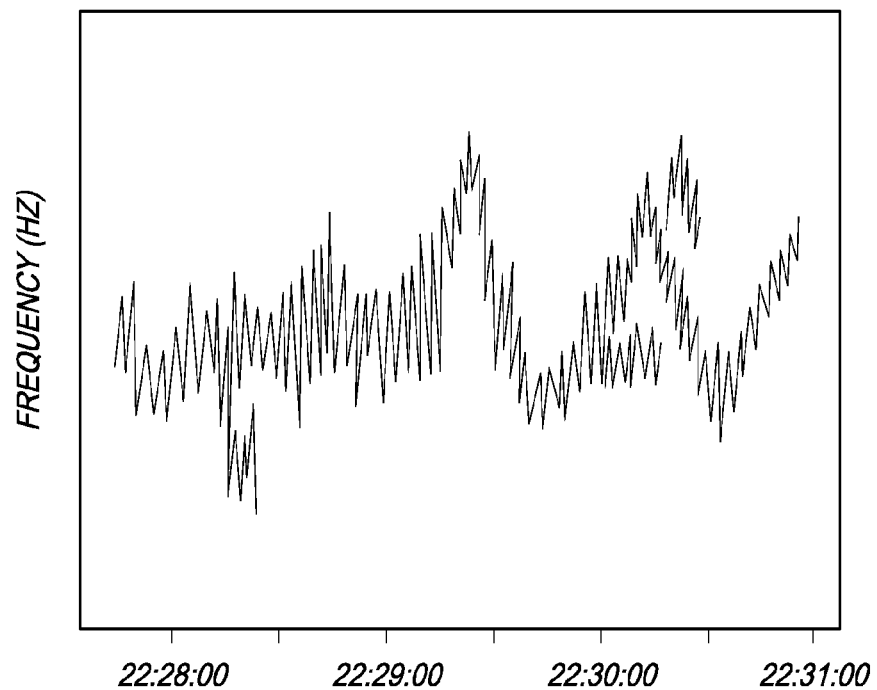
Figure 6D:
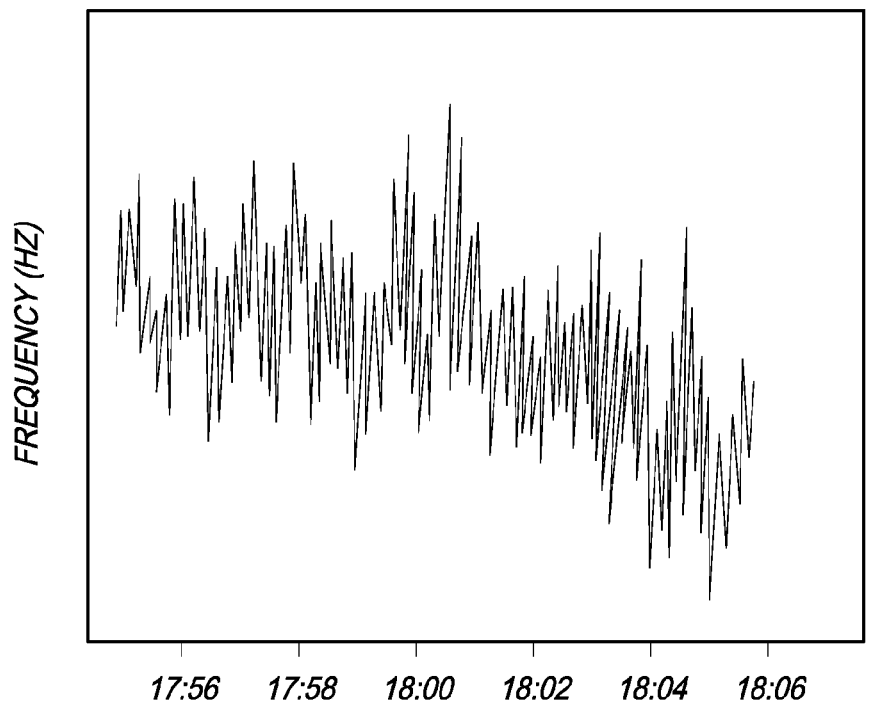

FIGS. 6C and 6D show two events that are unique for the entire data set which was analyzed. FIG. 6C shows groups of PMUs jumping off from the main frequency signal and sporadically missing data in chunks of time. FIG. 6D shows a single PMU operating at a different frequency than the rest for about 10 minutes. The behavior for both of these events could potentially be indicative of a grid island, where some groups of locations are operating independently of the others and warrant further investigation.

Figure 6E:
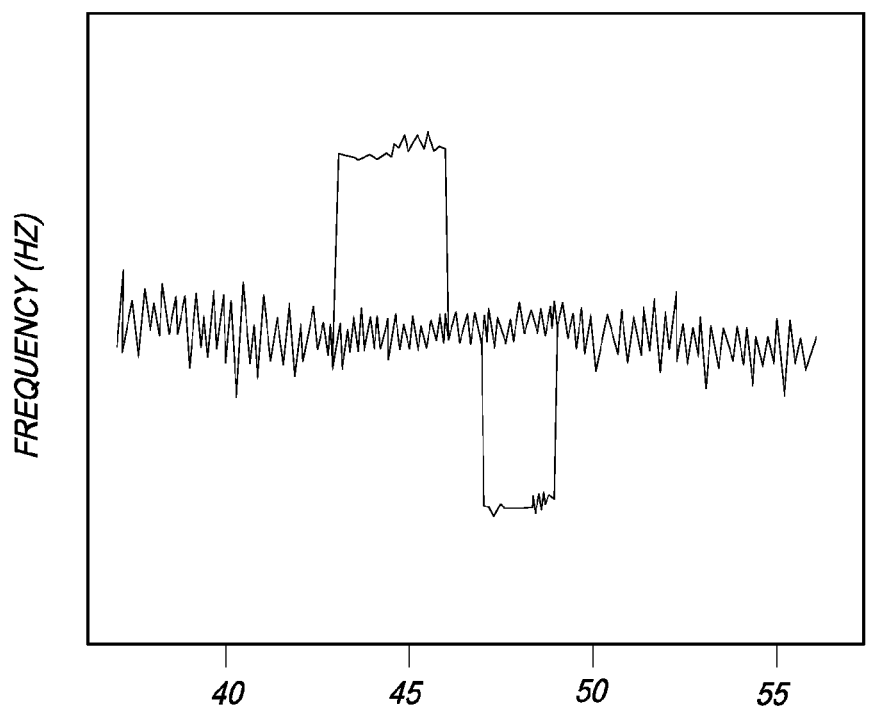

FIG. 6E shows an event including a jump in one direction directly followed by a jump in the opposite direction. The algorithm found several of these types of events which also may be further investigated.

Event detection algorithms may be used in 'real time' detection in some applications where it is desirable to analyze data shortly after it is received and to rapidly notify users about events of interest. Another example is for historical analysis where a year or more of data is compiled and iterative analysis may be performed over it to discover new techniques for data analysis. The analysis may be utilized to build a queryable meta-data repository of identified interesting events in large-scale electrical power grid data for use in power grid decision support systems in one example.

The results of the illustrative analysis upon electrical power system data show events where the interesting patterns such as sudden drops or opposite oscillations are detected at the sub-second level. This underscores the importance for this data of looking at the entire data set and not resorting to a more coarse time aggregation, such as the mean frequency over multiple seconds or minutes, in which case many of these features would be washed out.

Figure 7:
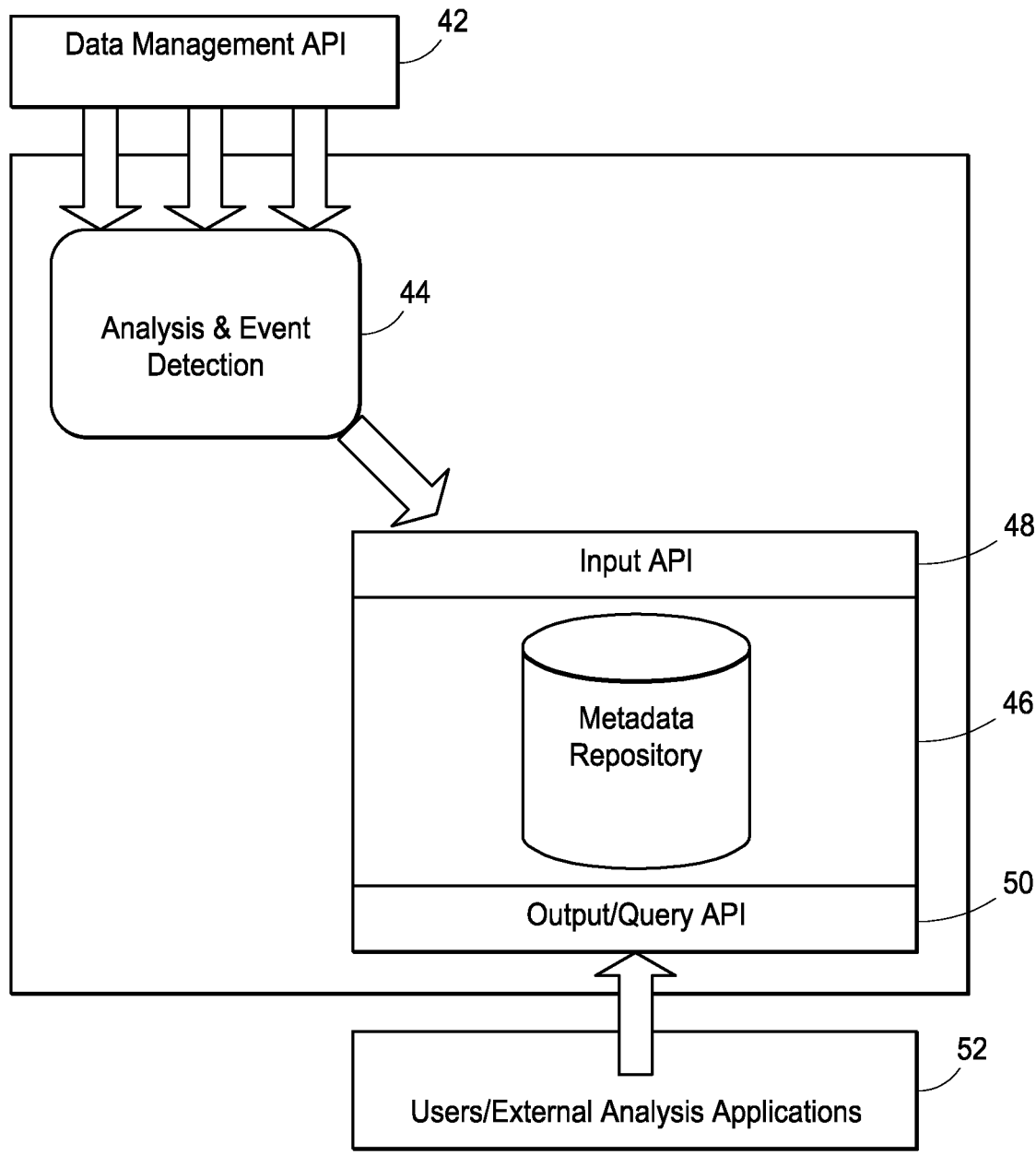
FIG. 7 is an illustrative representation of an event detection framework according to one embodiment.

Referring to FIG. 7, aspects of access and storage of data in a media repository are described with respect to the illustrated event detection framework according to one embodiment. As discussed herein, some aspects of the disclosure identify and extract events of interest from a multi-TB data set which may consist of historical PMU data (e.g., generator trip events shown in FIG. 6 which represent a power generator going off-line which may indicate when the infrastructure is under stress). Generator trips are characterized by sudden drops in frequency, with grid-wide a drop of 20 Hz or more occurring in less than one second. The illustrated example event detection framework of FIG. 7 is utilized to effectively identify, describe, store and retrieve events of interest according to one embodiment.

In one implementation, the framework takes data directly from a data management layer, through a data management API 42 designed to support both real-time streaming queries and queries over historical data. In another embodiment, the raw data sets are accessed directly.

The framework is designed to provide event information to end users and other analytical processes through the output API 50. One example of how this would be used is in 'real time' detection where an analyst wants to analyze data shortly after it is received and notify users about events. Another example is for historical analysis where an analyst wants a year or more of data to apply new techniques or perform iterative analysis over the data to discover new techniques.

As mentioned previously in one embodiment, a series of data analysis steps are used to first clean the data then identify event instances, which are then stored in metadata repository 46 for future retrieval. Output APIs 50 may be customized to specific events and used by applications 52 to both store and retrieve events from the metadata repository 46. The repository 46 is a relational database in one implementation and APIs 52 enable near-real time event retrieval for use in additional analysis.

As also discussed above, several data cleaning rules and event-detection algorithms may be developed using an exploratory design methodology including the R-Hadoop Integrated Processing Environment (RHIPE). Analysis and event detection 44 may perform interactive data analysis across the entire data set using a small cluster. This environment combines the flexibility of the R statistical programming model with the scalability of Hadoop, allowing interactive exploration of the entire data set. This approach may be utilized to identify events of interest, such as generator trips, which are characterized by sudden drops or opposite oscillations that occur within less than a second. The speed at which these events occur, and the difficulty characterizing them, underscores the importance in some embodiments of looking at the entire data set and not resorting to sampling or time aggregation, which would miss many of these features. As events are identified within analysis and event detection 44, they are passed to the Input API 48, which records the critical characteristics for future retrieval.

The input API 48 provides a convenient mechanism for analytical tools to add events to the database and includes both the analysis and event detection component 44 as well as external processes. The API 48 may be written in java, and can be called from any java application or from within the R event detection platform. The API 48 provides two levels of abstraction: a generic API that can be used for any event and event-specific APIs for known event types. The generic API supports setting metadata that is relevant to any type of event, such as the start and end time, the sensor recording the event, a pointer to raw data, and the type of event. In one embodiment, a new subclass of the generic event is created to easily record all of the metadata appropriate to an event. This subclass extends the generic API to support incorporation of all information relevant to a specific class of events. This specialized interface translates this information into the underlying schema in one embodiment.

The metadata schema is designed to be flexible enough to capture any type of event, even those not specific to the power grid domain. It is centered on an 'Event' object which contains the metadata common to any event (event type, start time, and end time). Another key object is the 'Sensor', such as a PMU 18, which collects the data used to detect events. In the case of the power grid domain, this would be a phasor or similar device. Events are typically connected to sensors through relationships, which include information such as the role the sensor is playing. For example, the first sensor to detect an event is often identified. Similarly, collections of sensors that behave as a single group may also be defined. To collect event specific information, such as the maximum frequency seen during an event, details may be associated with an event or sensor. These details are essentially key-value pairs, where the key is the type of detail being recorded. While ultimately a string, the input API 48 ensures the consistent use of keys across instances of an event in one embodiment.

The output API 50 enables efficient retrieval of events, and their associated details, from the database. Similar to the input API 48, the output API 50 has both a generic and event-specific abstraction in one embodiment. The generic API may be rarely used by external applications since ad hoc queries can be performed using SQL. Instead, it provides a base class that is used by event-specific subclasses. The event-specific API is particularly useful when answering user oriented questions about the data, such as 'Which phasors have been involved in the most generator trip events over the past N months' or 'What is the magnitude of the frequency difference between the highest and lowest points during the event'. Because events often have common queries such as these associated with them, the API provides a mechanism for efficiently answering the questions in a way that can be easily integrated into external applications 52.

At least some aspects of the disclosure provide alternatives to current approaches which typically operate on only small subsets of data acquired using mechanisms such as data sampling to generate these subsets. Further, given that the subsets of desired data constitute only a small percentage of the overall data set, such data reduction efforts can limit the types of events that can be identified. Furthermore, utilities must often analyze different data types including, e.g., Phasor Measurement Unit (PMU) data, Fast Fourier Transform (FFT) representations of the network state, as well as data from individual smart meters which may require different infrastructures to analyze data from these different modalities, which can create unnecessary confusion and complexity when performing multi-modal analyses. As described above, methods and apparatus of the disclosure describe example analysis techniques which may be applied to large-scale data sets including data of different modalities.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended aspects appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. A method of processing large-scale data regarding an electrical power grid, the method comprising:
   accessing a large-scale data set comprising information regarding an electrical power grid;
   processing data of the large-scale data set to identify a filter which is configured to remove erroneous data from the large-scale data set;
   using the filter, removing erroneous data from the large-scale data set; and
   after the removing, processing data of the large-scale data set to identify an event detector which is configured to identify events of interest in the large-scale data set.

2. The method of claim 1 further comprising applying the event detector to the large-scale data set to identify the events of interest.

3. The method of claim 1 wherein the processing to identify the filter comprises processing a data subset of the large-scale data set, the removing comprises applying the filter to the data subset, and the processing to identify the event detector comprises processing the data subset.

4. The method of claim 3 further comprising applying the filter to the large-scale data set and applying the event detector to the large-scale data set after the applying the filter to the large-scale data set.

5. The method of claim 1 wherein the processing to identify the filter comprises:
   defining an initial filter;
   applying the initial filter to the data,
   using results of the applying, revising the initial filter; and
   applying the revised filter to the data.

6. The method of claim 1 further comprising identifying a data subset of the large-scale data set, and wherein the processing to identify the filter comprises processing the data of the data subset by:
   defining parameters of the filter using the data subset;
   applying the filter to the data subset; and
   adjusting the parameters using results of the applying.

7. The method of claim 6 further comprising generating statistics regarding a characteristic of the electrical power grid, and the defining parameters comprises defining the parameters using the statistics.

8. The method of claim 6 wherein one of the parameters comprises a threshold of a length of time for a frequency provided by a phasor measurement unit (PMU) to be non-varying and indicative of a type of the erroneous data.

9. The method of claim 1 further comprising applying the event detector to a real-time data stream.

10. The method of claim 1 wherein the information comprises time series data obtained from an electrical power grid.

11. The method of claim 1 wherein the data is sensor data obtained from a plurality of sensors as a result of the sensors monitoring an electrical power grid.

12. A method of defining a model to be used to process large-scale data regarding an electrical power grid, the method comprising:
accessing a large-scale data set comprising information regarding a characteristic of an electrical power grid;
identifying a data subset of the large-scale data set;
processing the data subset to provide statistics of the characteristic of the electrical power grid; and
using the statistics, defining a model which is configured to process the information regarding the characteristic of an electrical power grid of the large-scale data set.

13. The method of claim 12 wherein the defining the model comprises:
specifying parameters of the model corresponding to the characteristic;
applying the model to the data subset; and
revising the parameters using results of the applying.

14. The method of claim 12 wherein the defining the model comprises defining a filter configured to remove erroneous data from the large-scale data set.

15. The method of claim 14 further comprising removing erroneous data from the data subset using the filter, and further comprising defining an event detector configured to identify events of interest within the large-scale data set after the removing.

16. The method of claim 12 wherein the defining the model comprises defining an event detector configured to identify events of interest using the information regarding the characteristic of the electrical power grid.

17. The method of claim 12 wherein the large-scale data comprises information regarding the characteristic of the electrical power grid comprising frequency generated by a plurality of phasor measurement units (PMUs) monitoring the electrical power grid.

18. The method of claim 12 wherein the processing comprises processing using distributed parallel processing, and further comprising, after the identifying, providing the data subset into a format suitable for distributed parallel processing.

19. A method of processing large-scale data regarding an electrical power grid, the method comprising:
identifying events of interest and erroneous data in a data subset of a large-scale data set which comprises information regarding an electrical power grid;
using the identified erroneous data, developing a filter to identify and remove the erroneous data;
applying the filter to remove the erroneous data;
using the identified events of interest, developing an event detector to identify the events of interest; and
after the applying the filter, applying the event detector to identify the events of interest.

20. The method of claim 19 wherein the developing the filter comprises defining a filter, applying the filter to the data subset, and revising the filter using results of the applying the filter to the data subset.

21. The method of claim 20 wherein the developing the event detector comprises developing using the data subset.

22. The method of claim 19 wherein the applyings of the filter and the event detector comprise applyings of the filter and the event detector to the large-scale data set.

23. The method of claim 19 wherein the applyings of the filter and the event detector comprise applyings of the filter and the event detector to data in real time.

24. The method of claim 19 further comprising storing the events of interest in a repository for subsequent access.

* * * * *